(12) United States Patent
Mukai (10) Patent No.: US 9,208,613 B2
(45) Date of Patent: Dec. 8, 2015

(54) ACTION MODELING DEVICE, METHOD, AND PROGRAM

(75) Inventor: Tomohiko Mukai, Tokyo (JP)

(73) Assignee: KABUSHIKI KAISHA SQUARE ENIX, Tokyo (JP)

( * ) Notice: Subject to any disclaimer, the term of this patent is extended or adjusted under 35 U.S.C. 154(b) by 177 days.

(21) Appl. No.: 13/982,850

(22) PCT Filed: Feb. 13, 2012

(86) PCT No.: PCT/JP2012/053291
§ 371 (c)(1),
(2), (4) Date: Jul. 31, 2013

(87) PCT Pub. No.: WO2012/111622
PCT Pub. Date: Aug. 23, 2012

(65) Prior Publication Data
US 2013/0307850 A1  Nov. 21, 2013

(30) Foreign Application Priority Data
Feb. 16, 2011 (JP) ................................ 2011-031341

(51) Int. Cl.
*G06T 17/10* (2006.01)
*A63F 13/40* (2014.01)
*G06T 13/40* (2011.01)
*G06F 17/50* (2006.01)

(52) U.S. Cl.
CPC ................ *G06T 17/10* (2013.01); *A63F 13/10* (2013.01); *G06T 13/40* (2013.01); *A63F 2300/646* (2013.01); *A63F 2300/6607* (2013.01); *G06F 17/50* (2013.01)

(58) Field of Classification Search
CPC combination set(s) only.
See application file for complete search history.

(56) References Cited

U.S. PATENT DOCUMENTS 6,320,988 B1  11/2001  Yamaguchi et al.
8,237,707 B2   8/2012  Furuhashi et al.
(Continued)

FOREIGN PATENT DOCUMENTS

JP    6-251122     9/1994
JP    8-063617     3/1996
(Continued)

OTHER PUBLICATIONS

U.S. Appl. No. 13/980,113 to Tomohiko Mukai, filed Jul. 17, 2013.
(Continued)

*Primary Examiner* — Leon T Cain, II
(74) *Attorney, Agent, or Firm* — Greenblum & Bernstein, P.L.C.

(57) ABSTRACT

Actions of a player character in a virtual three-dimensional space are determined for each of the extremities. The position of the end portion of each extremity is determined in the local coordinates of the extremity, with the fixed portion being the reference position. The position of the end portion is determined within a pre-defined range of access, then the joint angle of the intermediate portion is fixed, and the position of the intermediate portion is determined from the angle of rotation about the axis connecting the fixed portion and the end portion. The position of the intermediate portion is determined as angular information within the range of motion of the intermediate portion, which is defined in accordance with the position of the end portion. The shape of each extremity of the character is determined by the positional information about the end portion and the angular information about the intermediate portion.

10 Claims, 6 Drawing Sheets

(56) References Cited

U.S. PATENT DOCUMENTS

| | | | |
|---|---|---|---|
| 8,432,401 | B2 | 4/2013 | Mukai |
| 8,471,850 | B2 | 6/2013 | Furuhashi et al. |
| 2005/0075557 | A1 | 4/2005 | Kamiyama |
| 2009/0027386 | A1 | 1/2009 | Furuhashi et al. |
| 2009/0322763 | A1* | 12/2009 | Bang et al. .............. 345/474 |
| 2010/0097375 | A1 | 4/2010 | Tadaishi et al. |
| 2010/0182329 | A1 | 7/2010 | Yamaguchi et al. |
| 2011/0267357 | A1* | 11/2011 | Rennuit et al. .............. 345/473 |
| 2012/0225717 | A1 | 9/2012 | Kuroda et al. |

FOREIGN PATENT DOCUMENTS

| | | |
|---|---|---|
| JP | 9-231395 | 9/1997 |
| JP | 10-208072 | 8/1998 |
| JP | 2003-256873 | 9/2003 |
| JP | 2006-323804 | 11/2006 |
| JP | 2010-170279 | 8/2010 |

OTHER PUBLICATIONS

U.S. Appl. No. 13/945,192 to Hiroaki Saotome, filed Jul. 18, 2013.
U.S. Appl. No. 13/945,292 to Hiroaki Saotome, filed Jul. 18, 2013.
International Search Report (ISR) and Written Opinion (WO) in International Application No. PCT/JP2012/053291, dated Mar. 19, 2012.
Office Action from Japan Patent Office (JPO) in Japanese Patent Application No. 2011-031341, dated Mar. 2, 2012, together with an English language translation thereof.

\* cited by examiner

RANGE OF MOTION IN NORMAL STATE

| COORDINATES (x, y, z) | INTERMEDIATE PORTION MOTION RANGE (deg) |
|---|---|
| (0, 0, 0) | — |
| (1, 0, 0) | 0~45 |
| (0, 1, 0) | 0~35 |
| ⋮ | ⋮ |
| (15, 15, 14) | 0~50 |
| (15, 15, 15) | 0~60 |

RANGE OF MOTION IN INJURED STATE

| COORDINATES (x, y, z) | INTERMEDIATE PORTION MOTION RANGE (deg) |
|---|---|
| (0, 0, 0) | — |
| (1, 0, 0) | 0~20 |
| (0, 1, 0) | 0~15 |
| ⋮ | ⋮ |
| (15, 15, 14) | 0~25 |
| (15, 15, 15) | 0~30 |

FIG. 6

ACTION MODELING DEVICE, METHOD, AND PROGRAM

TECHNICAL FIELD

The present invention relates to modeling for determining an action by integrally defining the shape of each extremity having a joint in the middle in modeling of an action of a character having extremities each connected to the trunk via a joint.

BACKGROUND ART

As the computer technology has become sophisticated in recent years, more precise and realistic three-dimensional representations can be realized by CG (Computer Graphics). In the field of CG, actions of a character such as a person or an animal in a virtual space are represented by a skeleton model that is formed with bones connected by joints, and moves the respective bones at the joints.

In such a skeleton model to be operated in a virtual three-dimensional space, the range of motion of the bones connected to the respective joints are set, and the range of motion and the degrees of freedom of actions are varied with the features of the joints. In this manner, more realistic actions are performed. To realize more natural and smoother actions of a skeleton model, a technique of setting the range of motion of joints in a conventional manner by performing coordinate transformation to transform points on a spherical surface into points in a projecting plane, using projection for the respective joints is disclosed (see patent literature 1).

CITATION LIST

Patent Literature

Patent Literature 1: JP 2010-170279A (paragraph 0010 etc.)

SUMMARY OF INVENTION

Technical Problem

However, motion range models independent of one another are also prepared for the respective joints in patent literature 1. Joint motions of a person or an animal in reality might be restricted due to the influence of adjacent joints. Therefore, if the calculation for modeling is performed for each motion range, the end portions of the extremities might move to unnatural positions. Meanwhile, if the number of variables is increased so as to realize more natural motions, a complicated mathematical model is required for processing the variables.

The present invention aims to provide an action modeling device and the like that can model actions more similar to actual actions while reducing the number of variables required for specifying the actions in modeling of actions of each extremity connected to the trunk.

Solution to Problem

To achieve the above object, an action modeling device according to a first aspect of the present invention is an action modeling device that models an action of a character having an extremity that is connected to a trunk via a first joint and has a second joint in the middle, the extremity being rotatable around the first joint as a center within a predetermined range of angle. The action modeling device includes: a particular portion position determiner that determines a position of a particular portion located farther from a position of the first joint as a reference position than the second joint; an angle range data storage that stores angle range data defining the range of angle at which the second joint can be rotated, the angle range data being associated with the position of the particular portion relative to the first joint; and a second joint position determiner that determines a position of the second joint, based on the angle range data stored in the angle range data storage in accordance with the position of the particular portion determined by the particular portion position determiner.

In the above described action modeling device according to the first aspect, the position of the particular portion of an extremity connected to the trunk via the first joint is first determined, with the first joint being the reference position. The particular portion is located farther from the first joint than the second joint, the second joint being located in the middle of the extremity. After the position of the particular portion is determined with reference to the first joint, the position of the second joint is determined within the range of angle at which the second joint can be rotated, with respect to the position relative to the first joint. The range of angle is set in accordance with the position of the particular portion. That is, after the position of the particular portion of an extremity is determined with reference to the first joint, the joint angle of the second joint is fixed. Accordingly, the modeling of an action of the extremity can be performed by determining the angle of rotation of the second joint around the axis connecting the first joint and the particular portion as a center. Further, the angle of rotation of the second joint is determined within the range of angle of rotation that is set in accordance with the position of the particular portion. Accordingly, unnatural movements in the position of the particular portion of the extremity can be prevented.

Specifically, when modeling is performed on an arm or a leg having a joint that bends and stretches only in limited directions like the elbows and the knees of an actual person, the second joint of the target extremity can be prevented from unnaturally bending in the position of the particular portion located farther than the second joint. Accordingly, natural modeling of actions of the target extremity can be performed. Also, in the modeling of actions of the extremity, the shape of the extremity can be determined simply from the information about the position of the particular portion and the information about the angle of rotation of the second joint. Accordingly, the modeling of actions can be performed with a smaller amount of information.

In the above described action modeling device according to the first aspect, the character may be a character in a game, and the action modeling device may further include: a game status determiner that determines which one of a plurality of pre-defined statuses is a current status of progress of the game; the angle range data storage that stores a plurality of angle range data for the respective statuses, each of the plurality of angle range data defining different range of angle as the range of angle at which the second joint can be rotated; and the second joint position determiner that determines the position of the second joint, based on the angle range data corresponding to the status determined by the game status determiner among the plurality of angle range data stored in the angle range data storage.

In this case, the range of angle at which the second joint can be rotated can be changed in accordance with the current status in the game. When the character is injured in progress of the game, for example, the range of angle at which the second joint of the injured extremity can be rotated can be made narrower than normal, and natural action modeling can be performed on the character in accordance with the current status in the game. Other statuses in the game include the status of the clothes the character is wearing, and the surroundings of the character in the virtual space.

The above described action modeling device according to the first aspect may further include a motion range data storage that stores motion range data defining a range of motion of the particular portion, the range of motion being a range at which the particular portion can be located as a relative position from the first joint. The particular portion position determiner can determine the position of the particular portion, based on the motion range data stored in the motion range data storage. The angle range data storage can store the angle range data defining the range of angle at which the second joint can be rotated, the angle range data being associated with a position within the range of motion stored in the motion range data storage.

In this case, the position of the particular portion is determined within the defined range of motion, and the position of the second joint is determined within the range of angle at which the second joint can be rotated, in accordance with the position of the particular portion. Accordingly, when modeling is performed on an arm or a leg of a human-shaped character, for example, the position of the wrist of the arm or the ankle of the leg can be determined within a realistic range of access. In this manner, such action modeling as to cause a joint to unnaturally bend in the position can be prevented, and further, the extremity can be prevented from reaching a position that cannot be reached in reality. Thus, more natural human action modeling can be performed on a human-shaped character.

In the above described action modeling device according to the first aspect, the character may be a character in a game, and the action modeling device may further include: a game status determiner that determines which one of a plurality of pre-defined statuses is a current status of progress of the game; the motion range data storage that stores a plurality of motion range data for the respective statuses, each of the plurality of motion range data defining different range of motion as the range of motion of the particular portion; and the particular portion position determiner that determines the position of the particular portion, based on the motion range data corresponding to the status determined by the game status determiner among the plurality of motion range data stored in the motion range data storage.

In this case, the range of motion of the particular portion can be changed in accordance with the current status in the game. Accordingly, when the character is injured in progress of the game, for example, the range of motion of the particular portion of the injured extremity can be made narrower than normal, and natural action modeling can be performed on the character in accordance with the current status in the game.

The above described action modeling device according to the first aspect may further include: an extremity length changer that changes a length of the extremity while maintaining a constant ratio between a length from the first joint to the second joint and a length from the second joint to the particular portion; and an angle range data corrector that corrects the position of the particular portion relative to the first joint in accordance with the length of the extremity changed by the extremity length changer, the position of the particular portion relative to the first joint being associated with the angle range data and stored in the angle range data storage. The particular portion position determiner can specify the position of the particular portion of the extremity having the length changed by the extremity length changer, the position of the first joint being the reference position. The second joint position determiner can determine the position of the second joint, based on the angle range data in which the position of the particular portion relative to the first joint is corrected by the angle range data corrector.

The above described action modeling device further including the motion range data storage may further include a motion range data corrector that corrects the position of the particular portion relative to the first joint in accordance with the length of the extremity changed by the extremity length changer, the position of the particular portion being associated with the motion range data and stored in the motion range data storage. The particular portion position determiner determines the position of the particular portion, based on the motion range data in which the position of the particular portion relative to the first joint is corrected by the motion range data corrector.

In this case, the length of an extremity can be changed while a constant ratio is maintained between the length from the first joint to the second joint and the length from the second joint to the particular portion. When the length of the extremity is changed, the position of the particular portion relative to the first joint is corrected in accordance with the changed length of the extremity. Accordingly, natural action modeling can be performed not only on a character that stays in the same size, but also on a character that can be greatly changed in size.

Before the length of an extremity is changed, If the length of an extremity is changed after the position of the particular portion and the position of the second joint are determined (the determined positions are realistic position before the length of the extremity is changed), the particular portion and the second joint of the extremity having the length changed might exist in unrealistic positions (such as positions in which the particular portion and the second joint collide with obstacles). As a result, the position of the particular portion and the position of the second joint need to be re-determined. In this action modeling device, on the other hand, the position of the particular portion relative to the first joint, which is associated with angle range correction data and stored in the angle range data corrector, is corrected by the angle range data corrector. Accordingly, the position of the particular portion and the position of the second joint can be determined after the length of the extremity is changed, and the operation to determine those positions is performed only once.

The above described action modeling device according to the first aspect may further include an extremity length changer that changes a length of the extremity. The angle range data storage can store a plurality of angle range data for a plurality of range within range of length of the extremity, the extremity length changer being able to change the length of the extremity within the range of length, the plurality of angle range data defining different range of angle as the range of angle at which the second joint can be rotated. The particular portion position determiner can specify the position of the particular portion of the extremity having the length changed by the extremity length changer, with the position of the first joint being the reference position. The second joint position determiner can determine the position of the second joint, based on the angle range data corresponding to the length of the extremity changed by the extremity length changer.

In the action modeling device further including the motion range data storage, the motion range data storage stores motion range data for range within the range of length of the extremity, the extremity length changer being able to change the length of the extremity within the range of length, the motion range data defining different range of motion as the range of motion of the particular portion. The particular portion position determiner determines the position of the particular portion, based on the motion range data corresponding to the length of the extremity changed by the extremity length changer among the motion range data stored in the motion range data storage.

In this case, with respect to the length of an extremity, the length from the first joint to the second joint and the length from the second joint to the particular portion can be changed. When the length of the extremity is changed, a different range of angle at which the second joint can be rotated may be used in the position of the particular portion relative to the first joint, in accordance with the changed length of the extremity. Accordingly, appropriate action modeling in accordance with sizes and shapes of extremities can be performed not only on a character that stays in the same size and shape, but also on a character that can be greatly changed in size and shape.

To achieve the above object, an action modeling method according to a second aspect of the present invention is An action modeling method for modeling an action of a character in a computer apparatus, the character having an extremity that is connected to a trunk via a first joint and has a second joint in the middle, the extremity being rotatable around the first joint as a center within a predetermined range of angle. The action modeling method may include the steps of: storing angle range data beforehand into a storage device provided in the computer apparatus, the angle range data defining the range of angle at which the second joint can be rotated, the angle range data being stored associated with a position of a particular portion relative to the first joint, the particular portion being located farther from a position of the first joint than the second joint of the extremity; determining the position of the particular portion through a predetermined arithmetic operation by a processing device provided in the computer apparatus, with the position of the first joint being a reference position; and determining a position of the second joint by the processing device provided in the computer apparatus, referring to the angle range data stored in the storage device in accordance with the position of the particular portion determined by the processing device.

To achieve the above object, a program according to a third aspect of the present invention is a program for causing a computer apparatus to model an action of a character having an extremity that is connected to a trunk via a first joint and has a second joint in the middle, the extremity being rotatable around the first joint as a center within a predetermined range of angle. The program causes the computer apparatus to function as: an angle range data storage that stores angle range data beforehand into a storage device provided in the computer apparatus, the angle range data defining the range of angle at which the second joint can be rotated, the angle range data being stored in association with a position of a particular portion relative to the first joint, the particular portion being located farther than the second joint of the extremity; a particular portion position determiner that determines the position of the particular portion, the position of the first joint being a reference position; and a second joint position determiner that determines a position of the second joint, based on the angle range data stored beforehand in the storage device in accordance with the position of the particular portion determined by the particular portion position determiner.

The above described program according to the third aspect can be recorded on a computer readable recording medium, and be then provided. This computer readable recording medium may be a recording medium that is detachably provided in the above described computer apparatus and is provided independently of the computer apparatus. This computer readable recording medium may be a recording medium such as a fixed disk device that is installed in the computer apparatus and is provided together with the computer apparatus. The above described program according to the third aspect may be distributed from a server apparatus existing in a network to the computer apparatus via the network, with the data signals of the program being superimposed on carrier waves.

Also, a method of carrying out the procedures of the respective steps included in the above described program according to the third aspect is also within the scope of the present invention.

DESCRIPTION OF EMBODIMENTS

The following is a description of embodiments of the present invention, with reference to the accompanying drawings.

Figure 1:
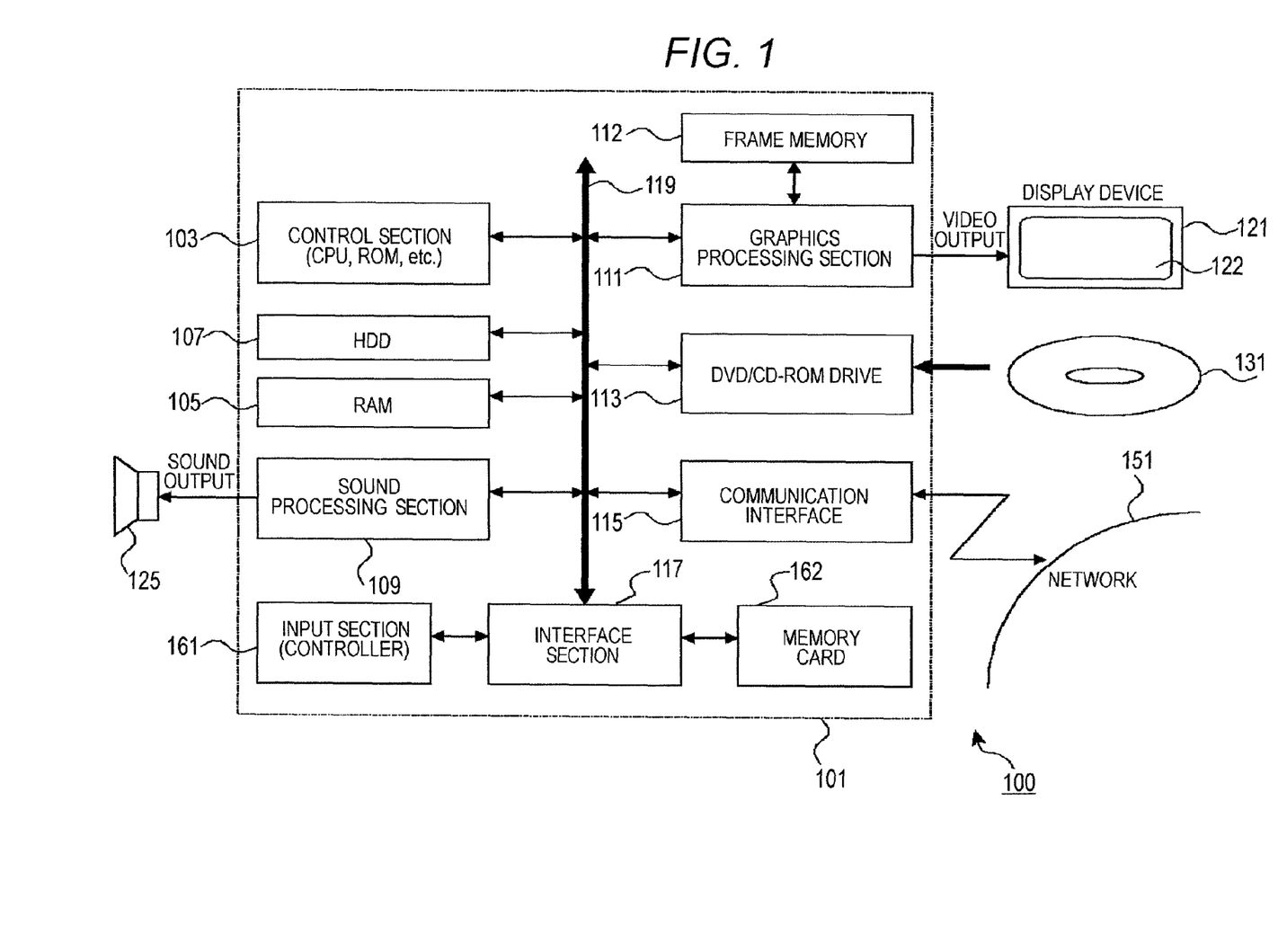
FIG. 1 is a block diagram showing the structure of a video game apparatus to which an embodiment of the present invention is applied.

FIG. 1 is a block diagram showing the structure of a video game apparatus to which this embodiment is applied. As shown in the drawing, the video game apparatus 100 is constructed around a main body 101. The main body 101 includes a control section 103, a RAM (random access memory) 105, a hard disk drive (HDD) 107, a sound processing section 109, a graphics processing section 111, a DVD/CD-ROM drive 113, a communication interface 115, and an interface section 117 that are connected to an internal bus 119.

The sound processing section 109 of this main body 101 is connected to a sound output device 125 that is a speaker, and the graphics processing section 111 is connected to a display device 121 that has a display screen 122. The DVD/CD-ROM drive 113 can have a recording medium (a DVD-ROM or a CD-ROM) 131 mounted thereon. The communication interface 115 is connected to a network 151. The interface section 117 has an input section (controller) 161 and a memory card 162 connected thereto.

The control section 103 includes a CPU (central processing unit), a ROM (read only memory), and the like, and executes a program stored in the HDD 107 or the recording medium 131, to control the main body 101. The control section 103 includes an internal timer. The RAM 105 is a work area of the control section 103, and information about the motion range of the wrists, twist angles of the elbow and knees, and the like of a player character, which will be described later, is temporarily stored in the RAM 105. The HDD 107 is a storage area for storing programs and data. When the program being executed by the control section 103 issues a sound output instruction, the sound processing section 109 interprets the instruction, and outputs a sound signal to the sound output device 125.

In accordance with a draw command that is output from the control section 103, the graphics processing section 111 loads image data into a frame memory 112 (although shown outside the graphics processing section 111, it is provided in the RAM contained in the chip forming the graphics processing section 111), and outputs a video signal for displaying an image on the display screen 122 of the display device 121. The 1-frame time of the image contained in the video signal that is output from the graphics processing section 111 is 1/60 second, for example. There are two memories provided as the frame memory 112, and, for each frame period, the memory being used is switched between the one for data writing and the one for data reading.

The graphics processing section 111 generates the image data of two-dimensional images formed by subjecting objects (the player character, non-player characters, and objects other than the characters) existing in a virtual three-dimensional space to perspective transformation with a virtual camera, and writes the image data into the frame memory 112.

The DVD/CD-ROM drive 113 reads a program or data from the recording medium 131. The communication interface 115 is connected to the network 151, and performs communication with other computers. The input section 161 includes cursor keys and operation buttons. The position of the player character in the virtual three-dimensional space is moved in accordance with an instruction that is input through the cursor keys of the input section 161.

The interface section 117 outputs data input from the input section 161 to the RAM 105, and the control section 103 interprets the data and performs an arithmetic operation. Based on an instruction from the control section 103, the interface section 117 puts the data indicating progress of a game stored in the RAM 105 into the memory card 162, and reads the data of a suspended game stored in the memory card 162 to transfer the data to the RAM 105.

The program and data for playing a game on the video game apparatus 100 are first stored in the recording medium 131, for example. The data stored in the recording medium 131 contains the graphics data for forming the objects existing in the game space (the virtual three-dimensional space). The program and data stored in the recording medium 131 are read by the DVD/CD-ROM drive 113 at the time of execution, and are loaded into the RAM 105. The control section 103 processes the program and data loaded into the RAM 105, outputs a draw command to the graphics processing section 111, and outputs a sound output instruction to the sound processing section 109. Intermediate data generated while the control section 103 is performing the processing is stored into the RAM 105.

In a video game according to this embodiment, three-dimensional objects exist in the virtual three-dimensional space that serves as the game space, and images formed by subjecting those objects to perspective transformation with the virtual camera are displayed as game images on the display screen 122 of the display device 121. The objects existing in the virtual three-dimensional space include the player character that is operated through inputs from the input section 161 of the player, non-player characters (such as an enemy character, operated through the control section 103) that are characters other than the player character, and the like. The game progresses as those characters fight in a battle. In the battle, the characters continue to attack each other until one of them becomes unable to keep fighting. Also, the player character might be injured in attacks from the enemy character, and the injury might restrict the player character from moving freely.

As for actions of the player characters, the player character performs actions modeled through inputs from the input section 161 of the player. In the modeling of actions, the shapes of the respective extremities of the player character are modeled after the shape of the player character performing the series of actions at each time point. In the following, the modeling of the shapes of the extremities in the modeling of actions of the player character is described.

First, the extremities subject to the shape modeling are sites each formed with two bones, such as an upper arm and a lower arm or a thigh and a shin, in the skeleton model of the player character. In the modeling of the shapes of the extremities of the player character, the positions of end portions are first determined within the range of access of the end portions (such as the wrist of an arm and the ankle of a leg, hereinafter referred to as the end portions), the range of access being defined for the respective extremities, fixed sites (such as the shoulder at the root of an arm and the crotch at the root of a leg, hereinafter referred to as the fixed portions) being used as a center of the range of access.

The positions of joints (such as the elbow of an arm and the knee of a leg, hereinafter referred to as the intermediate portions) at the mid portions of the extremities, and the angles (twist angles) of rotation around the axes connecting the fixed portions and the end portions as a center are then determined within the range of motion of the intermediate portions. In the following, the procedures for the modeling of the extremities are described in detail, with the right arm being taken as an example.

Figure 2:
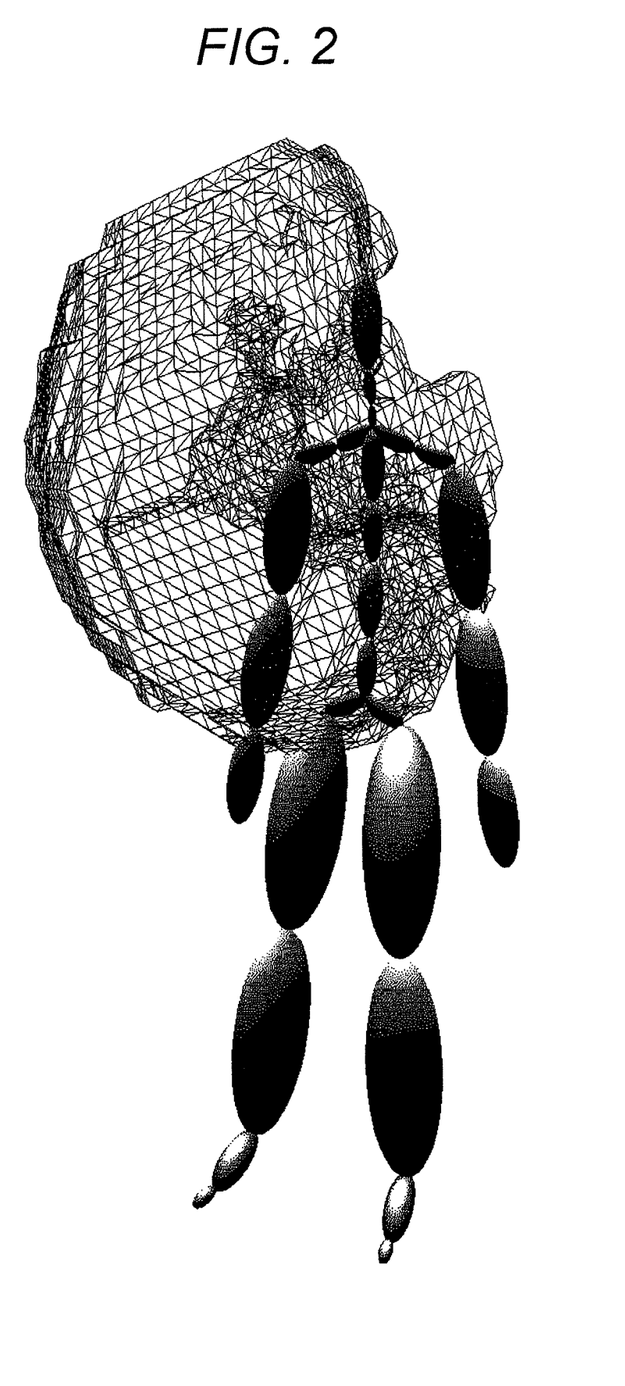
FIG. 2 is a diagram showing the range of access of the right wrist of a skeleton model for a player character according to the embodiment of the present invention.

FIG. 2 shows a skeleton model and the range of access of the right wrist (the end portion) of the right arm of the skeleton model. As shown in the drawing, the range of access of the end portion of the right arm is defined around the shoulder (a fixed portion) as a center. The range of access of the end portion of each one of the extremities is defined in the same manner as above. In the procedures for the modeling of the right arm, the position of the end portion is first determined within the range of access of the end portion. If the position of the end portion is set within the range of access, the position of the end portion is determined to be the set position. If the position of the end portion is set outside the range of access, however, the position of the end portion is corrected and determined to be the position closest to the set position within the range of access.

After the position of the end portion is determined, the shape of the joint angle at the elbow (the intermediate portion) between the upper arm and the lower arm of the right arm is determined from the fixed portion and the end portion having its position determined. The position of the intermediate portion is then determined from the angle of rotation of the intermediate portion around the end portion or the fixed portion, the end portion or the fixed portion being a rotation center, or more specifically, from the range of the angle of rotation of the intermediate portion around the axis that is the straight line connecting the end portion and the fixed portion.

Figure 3:
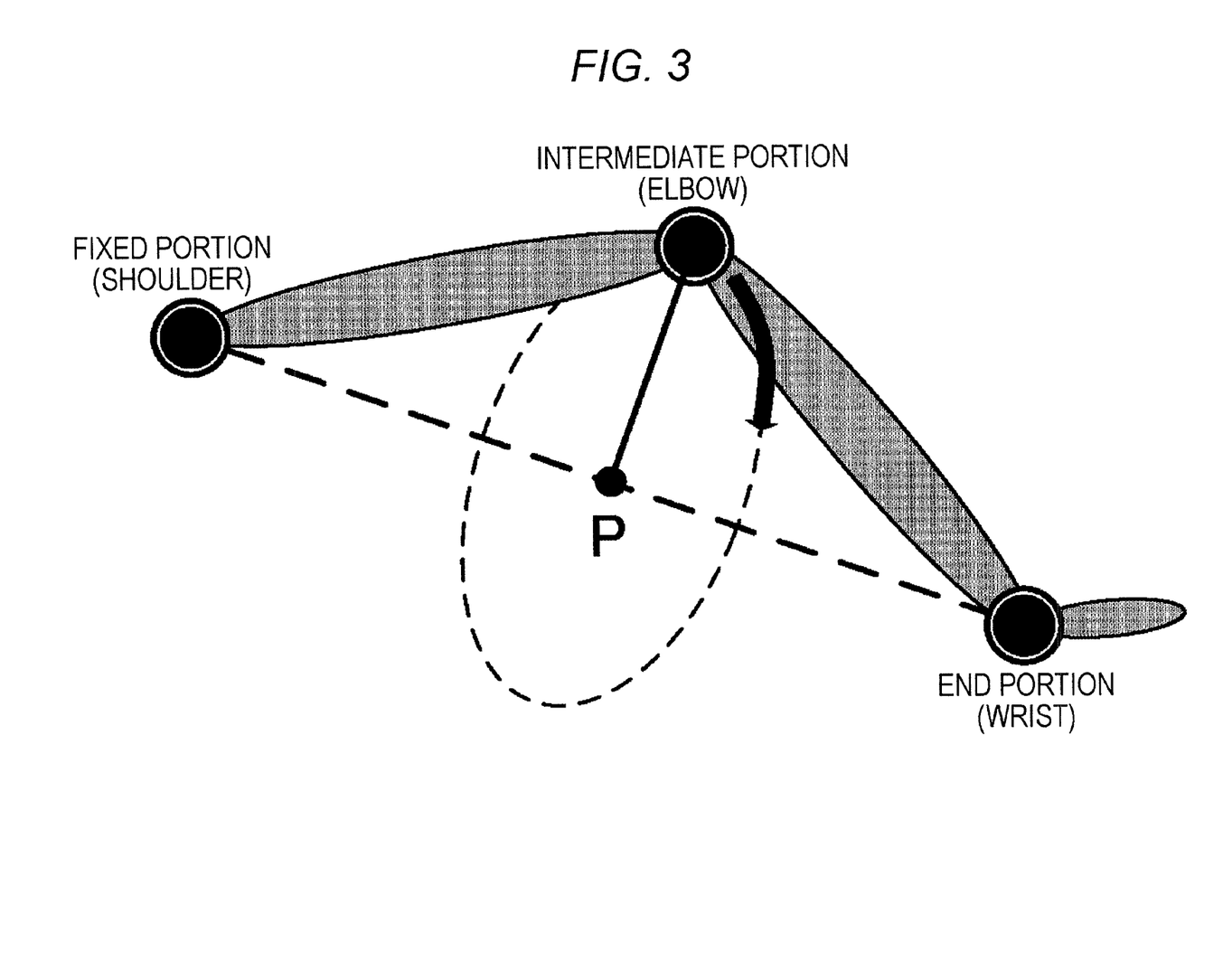
FIG. 3 is a diagram showing the rotation of an intermediate portion in a case where the position of the end portion is determined.

FIG. 3 shows the right arm of the skeleton model shown in FIG. 2, and rotation of the intermediate portion around the axis that is the straight line connecting the fixed portion and the end portion, the axis being a rotation center. As shown in the drawing, where the positions of both end portions have been determined, the position of the intermediate portion is determined only from the circumference of a circle, with the center point of the circle being the point of intersection P between the axis and the perpendicular extending from the intermediate portion to the axis. The position of the intermediate portion on the circumference of the circle is then determined from the position of the end portion within the range of the angle of rotation in accordance with the position of the end portion, by using a conventional technique (such as the inverse kinematics, the specifics thereof are not described herein).

When the angle of rotation of the intermediate portion is determined, the direction of rotation is a right screw direction, with the traveling direction being a direction toward the end portion of the axis. In the plane formed with the axis and the right arm (the respective sides of the upper arm and the lower arm), the position of the intermediate portion that is parallel to the z-axis of the local coordinates (x, y, z) defined in the right arm is set as the reference point at which the angle of rotation of the intermediate portion is 0, and the range of motion of the angle of rotation of the intermediate portion is thus defined. The definition of the reference point of rotation of the intermediate portion is not limited to that, and any definition method may be used, as long as the range of motion is specified around the reference point.

Figure 4A:
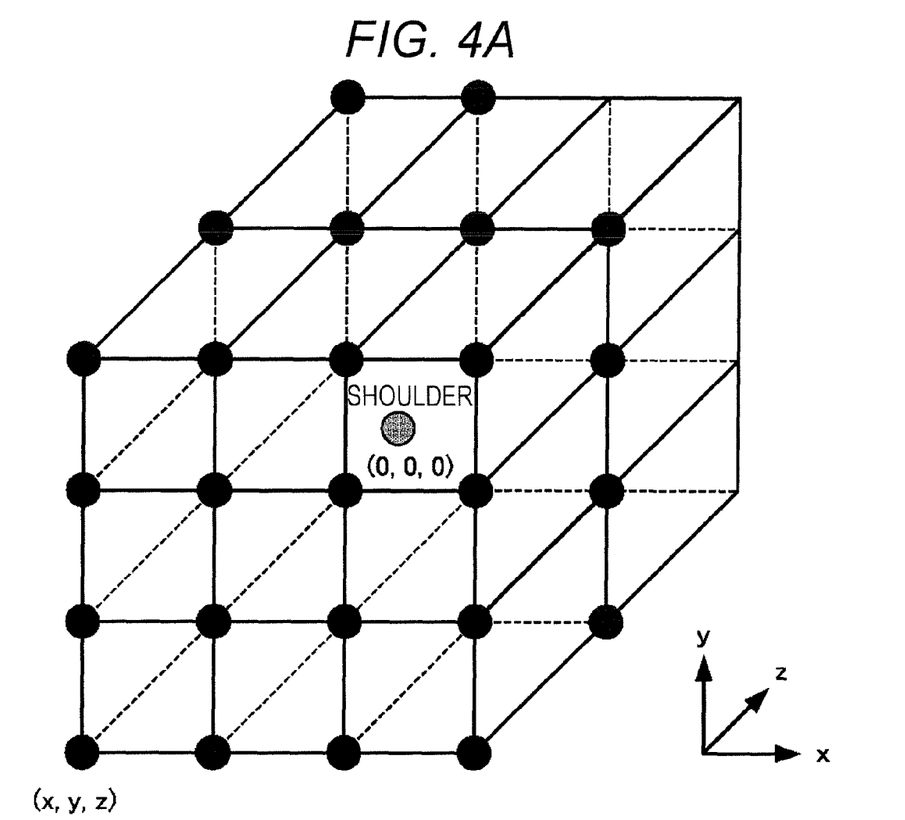
FIGS. 4A and 4B are diagrams showing the points of access of the end portion and stored ranges of motion of the intermediate portion.
Figure 4B:
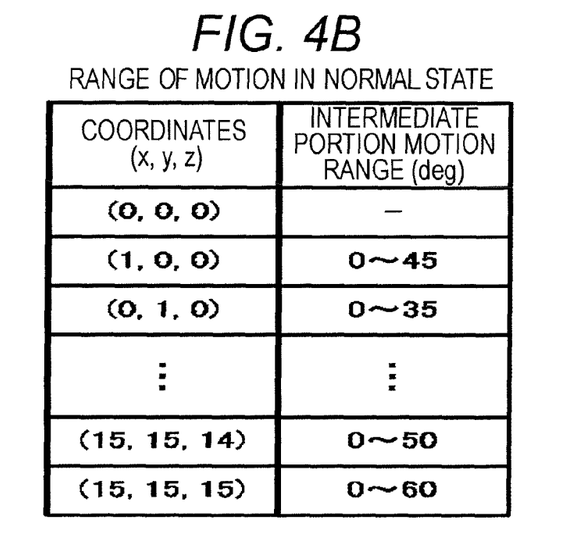

Next, the range of motion that varies with the position of the end portion is described. FIG. 4A shows some access positions of the end portion, which are defined in a grid-like graph, with the shoulder being the center (0, 0, 0) of the local coordinates (x, y, z) defined in the right arm. The range of motion of the intermediate portion is defined in the access positions of the end portion shown in the grid-like graph. FIG. 4B shows the range of motion of the intermediate portion in respective access positions of the end portion, which are stored in the RAM 105.

As shown in FIG. 4A, the positions (black dots) that the end portion having the range of motion of the intermediate portion defined can reach are determined in a grid-like fashion in the local three-dimensional coordinates, the center of which is the fixed portion (the shoulder: the local coordinates (0, 0, 0)) of the right arm. In the coordinates in the positions that cannot be reached, the range of motion of the intermediate portion is not defined.

As shown in FIG. 4B, the range of motion of the intermediate portion, which are defined in the respective positional coordinates shown in FIG. 4A, are stored in the RAM 105. In practice, when the end portion is located in coordinates in which the range of motion of the intermediate portion is defined, the position of the intermediate portion is determined within the range of motion. If the position of the intermediate portion is set within the range of motion, the position of the intermediate portion is determined to be the set position. However, if the position of the intermediate portion is set outside the range of motion, the position of the intermediate portion is corrected and determined to be the position closest to the set position within the range of motion.

Based on the above, the coordinates of the position of the end portion are determined to be (0, 1, 0), and the range of motion of the intermediate portion is then determined to be a range of 0 to 35 (degrees), to determine the shape of the right arm. In this manner, the shape of the right arm is modeled, based on the four variables, i.e., the three variables representing the position within the range of motion of the wrist and the one variable representing the angle of rotation of the elbow.

When the position of the end portion is within the range of access of the end portion but is not located in the coordinates in which the range of motion of the intermediate portion is defined, the range closest to the position of the end portion within the range of motion of the intermediate portion defined in the coordinates is determined to be the range of motion of the intermediate portion when the end portion is located in that position.

Figure 5A:
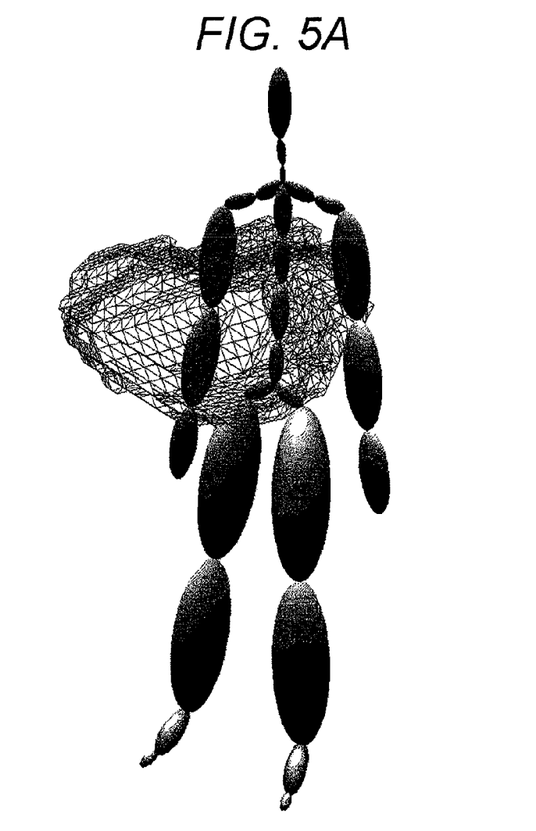
FIGS. 5A and 5B are diagrams showing the range of access of the end portion and the range of motion of the intermediate portion of the player character at the time of an injury.
Figure 5B:
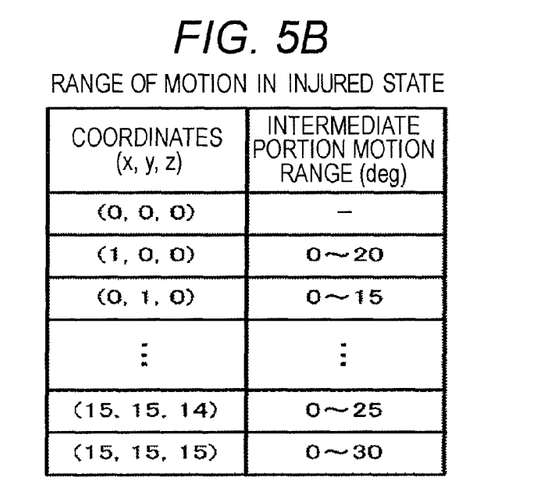

In some cases, the player character is injured in a battle against an enemy character during a game. The modeling of actions to be performed by the injured player character reflects the injury. FIG. 5A shows the range of access of the right wrist of a skeleton model related to the modeling of the actions of the right arm in a case where such an injury has occurred in the right upper arm of the player character. FIG. 5B shows the range of motion of the right elbow in that case.

As shown in FIG. 5A, in a case where an injury has occurred in the right upper arm of the player character, the range of access of the right wrist is smaller than the range of access shown in FIG. 2. The range of motion of the intermediate portion shown in FIG. 5B in a case where an injury has occurred in the right upper arm are narrower than the range of motion of the intermediate portion in regular cases shown in FIG. 4B. This is because the range of actions to be performed by the extremities is narrowed due to the injury in the right upper arm of the player character, just like the range of actions of an actual person restricted in the case of an injury.

Figure 6:
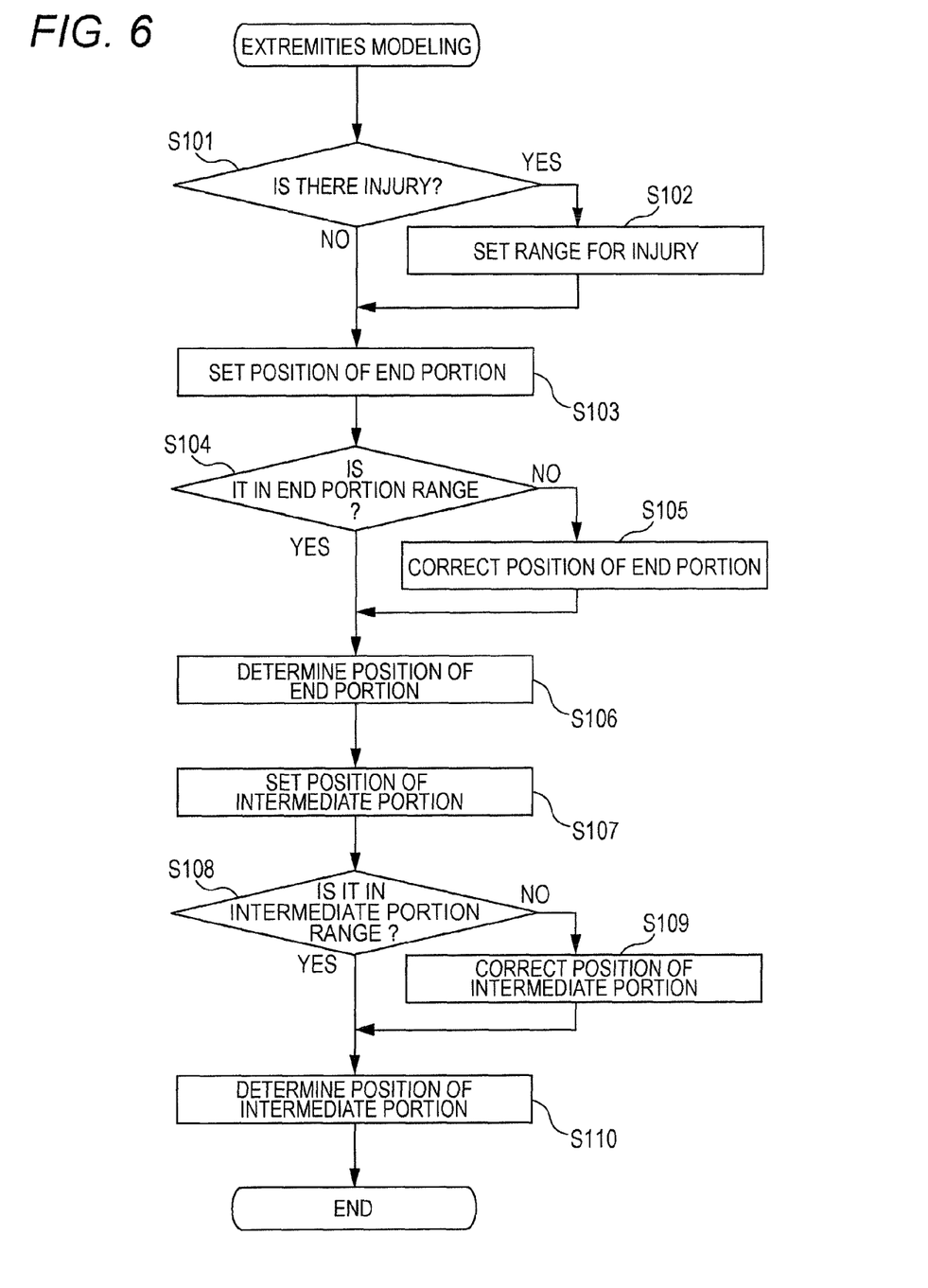
FIG. 6 is a flowchart showing an operation for determining the shape of the right arm.

Next, an operation to be performed in the video game apparatus 100 is described. FIG. 6 is a flowchart showing an extremity modeling operation to be performed in the video game apparatus 100. First, in this extremity modeling operation, the control section 103 determines whether the player character is injured in an extremity (step S101). If the player character is determined to be injured, the control section 103 sets a range of access and a range of motion to be applied to the range of access of the end portion and the range of motion of the intermediate portion at the time of an injury on the player character (step S102).

If the player character is determined not to be injured in step S101, or after the range of access and the range of motion to be applied at the time of an injury are set in step S102, the control section 103 sets the position of the end portion in accordance with an operation input through the input section 161 of the player (step S103). After the position of the end portion is set, a check is made to determine whether the set position is within the range of access of the end portion (step S104). If the set position is determined not to be within the range of access, the control section 103 corrects and sets the position of the end portion within the range of access closest to the set position (step S105).

If the position of the end portion is determined to be within the range of access in step S104, or after the position of the end portion is corrected and set in step S105, the control section 103 determines the position of the end portion to be the set position (step S106). After the position of the end portion is determined, the control section 103 sets the position of the intermediate portion in accordance with an operation input through the input section 161 of the player by using a conventional technique such as the inverse kinematics (step S107). After the position of the intermediate portion is set, a check is made to determine whether the set position is within the range of motion of the intermediate portion (step S108).

If the set position is determined not to be within the range of motion, the control section 103 corrects and sets the position of the intermediate portion within the range of motion closest to the set position (step S109). If the position of the intermediate portion is determined to be within the range of motion in step S108, or after the position of the intermediate portion is corrected and set in step S109, the control section 103 determines the position of the intermediate portion to be the set position (step S110).

As described above, in the modeling of an action of the player character in this embodiment, the position of the end portion of an extremity is first determined, with the fixed portion of the extremity being the reference. After the position of the end portion is determined, the position of the intermediate portion is determined within the range of motion of the intermediate portion, which is defined in accordance with the position of the end portion. That is, after the position of the end portion of an extremity is determined on the basis of the fixed portion, the angle of the joint at the intermediate portion is determined, and the angle of rotation of the intermediate portion around the axis connecting the fixed portion and the end portion is determined within the range of motion that varies with the position of the end portion. In this manner, an action of the extremity can be modeled.

Accordingly, of the extremities of the player character, the joints such as the elbows and knees that bend and stretch can be prevented from unnaturally bending in positions such as the wrists and ankles of the extremities, and natural modeling of actions of the extremities of the player character can be performed. Also, in the modeling of actions of the extremities, the shapes of the extremities can be determined simply from the information about the position of the end portions and the information about the angles of rotation of the intermediate portions. Accordingly, the modeling of actions can be performed with a smaller amount of information. The reduced amount of information required in the modeling is advantageous to real-time processing to be performed in parallel with progress of the game.

Also, the position of each end portion is determined within the range of access, and the range of motion of the intermediate portion is defined in accordance with the position within the range of access. Accordingly, in the case of a human-shaped player character, the positions of the wrists of the arms and the ankles of the legs can be determined within actually accessible range. Further, in accordance with the positions, modeling of such actions as to cause unnatural bending of joints can be prevented, and actions of the human-shaped character can be modeled on more natural human movements.

Also, in a case where the player character is injured in a battle against an enemy character, the range of access of each end portion and the range of motion of each intermediate portion become narrower than normal due to the injury. Accordingly, actions of the player character can be modeled on natural movements in accordance with situations in the game.

The present invention is not limited to the above described embodiment, and various changes and modifications may be made to the embodiment. The following is a description of modifications that can be made to the above described embodiment of the present invention.

Although the lengths of the extremities of the player character have not been described in the above described embodiment, the lengths of the extremities may change in the process of modeling actions of the player character. In that case, the length of each extremity may be changed while a constant ratio is maintained between the length from the fixed portion to the intermediate portion and the length from the intermediate portion to the end portion. Alternatively, the length of each extremity may be changed in such a manner that the ratio also changes. In a case where the entire player character is expanded or contracted, the lengths of the extremities are also changed while a constant ratio is maintained between the length from the fixed portion to the intermediate portion and the length from the intermediate portion to the end portion.

In a case where the extremities (or the entire character) become larger while a constant ratio is maintained between the length from the fixed portion to the intermediate portion and the length from the intermediate portion to the end portion, when the range of access of the end portions become wider, data correction is performed so that the grid intervals in the grid-like graph shown in FIG. 4A defining the range of motion of an intermediate portion become longer (when the extremities becomes smaller, the data correction is performed so that the grid intervals become shorter). For example, in a case where the size of the player character is doubled, and the lengths of the extremities are also doubled, the grid point (1, 0, 2) in the local coordinates is corrected and set at (2, 0, 4) in the local coordinates.

By performing such correction, the player character is made larger or smaller so that the lengths of the extremities are changed, before the positions (the end portions and the intermediate portions) of the extremities of the player character in the original size are determined. After the lengths of the extremities of the player character are changed, the positions of the end portions of the extremities are determined (the determined positions of the respective end portions are not unrealistic positions, such as positions in which the end portions collide with obstacles). After that, the positions of the intermediate portions of the extremities are determined by using the above described corrected data.

In a case where the range of motion of an intermediate portion having the corresponding end portion located in a predetermined position changes as the lengths of the extremities are changed, if the position of the intermediate portion is located outside the motion of range, the position of the intermediate portion may be corrected and adjusted to the closest position within the range of motion, as in the above described embodiment.

In this modification, the corrected data is applied to first change the lengths of the extremities, and then determine the positions of the end portions and the positions of the second joints. Before the lengths of the extremities are changed, if the lengths of the extremities are changed by enlarging the player character after the positions of the end portions and the positions of the intermediate portions are determined (the determined positions are realistic positions before the lengths of the extremities are changed), the extremities having the lengths changed might have the end portions existing in unrealistic positions such as positions in which the end portions collide with obstacles. Even the intermediate portions might be located in unrealistic positions. In such a case, the positions of the end portions and the positions of the intermediate portions need to be re-determined.

In this modification, on the other hand, the grid interval data is corrected, and the corrected data is applied, so that the positions of the end portions and the intermediate portions of the respective extremities having the lengths changed are determined after the changes in the lengths of the extremities, such as expansion or contraction of the player character, are ensured. Accordingly, the positions of the end portions and the intermediate portions of the respective extremities do not need to be re-determined, but can be determined at once. Thus, processing load can be reduced. If the grid interval data needs to be corrected, the processing load required for that is very small, and does not present a problem like the processing load required in a case where the lengths of the extremities are changed after the positions of the end portions and the intermediate portions are determined.

Also, as described in the above embodiment, the motion range data of an intermediate portion defined in the respective positional coordinates shown in FIG. 4A contain the data of range of motion in accordance with various changes of the lengths. In that case, when the lengths of the extremities are changed, the range of motion of each intermediate portion can be varied with changes in the length.

As in a case where the entire player character is expanded or contracted, the lengths of the extremities may be changed while a constant ratio is maintained between the length from the fixed portion to the intermediate portion and the length from the intermediate portion to the end portion, or the ratio between the length from the fixed portion to the intermediate portion and the length from the intermediate portion to the end portion may be changed. Further, in a case where the length of an extremity does not change, but the ratio between the length from the fixed portion to the intermediate portion and the length from the intermediate portion to the end portion is changed, the length of the extremity changes accordingly, and therefore, such a case also belongs to this modification.

In the above manner, not only a character in the same shape can be operated, but also the character can be changed in various shapes as the game progresses. Appropriate modeling of actions can also be performed on the changed character in accordance with the sizes and shapes of the extremities. Also, the player character can be made to have various shapes while the player character is made to perform natural actions. Accordingly, the player can obtain interest of the game. For example, in a case where the player character can attack an enemy character simply by thrusting a hand forward, modeling can be performed so that the range of motion of the elbow becomes narrower as the hand reaches forward.

The length of an extremity may be the same but the range of access of the end portion of the extremity may vary between a case where the ratio between the length from the fixed portion to the intermediate portion and the length from the intermediate portion to the end portion is constant, and a case where the ratio varies. For example, as for the range of access of the wrist of the right arm in the skeleton model shown in FIG. 2 in the above described embodiment, in a case where the ratio between the length from the fixed portion to the intermediate portion and the length from the intermediate portion to the end portion is constant, the range of access becomes wider. In a case where the ratio varies, on the other hand, the range of access may change so that the range of access on the back face side of the skeleton model becomes wider.

By such a technique, a virtual character that has extremities changing in size and shape relative to the trunk, such as a character having extremely long arms, can be used as the character whose actions of extremities are modeled in the present invention. Also, the range of access of the end portions and the range of motion of the intermediate portions of the extremities can be appropriately set in accordance with the trunk and the extremities of the character. Accordingly, appropriate modeling of actions in accordance with the sizes and shapes of extremities can be performed even on a virtual character that has an extremely large extremity or has an extremity in which the ratio between the length from the fixed portion to the intermediate portion and the length from the intermediate portion to the end portion varies before and after a change.

In a case where the sizes and shapes of the extremities (or the entire character) are changed to larger sizes and shapes, the extremities normally become slower in action, and therefore, the range of access of the end portions and the range of motion of the intermediate portions of the extremities may be narrowed. In a case where the sizes and shapes are changed to smaller ones, the extremities normally become quicker in action, and therefore, the range of access of the end portions and the range of motion of the intermediate portions of the extremities may be widened.

In the above described embodiment, the modeling of actions of extremities has been described through examples of modeling of actions of extremities each having one joint, such as the arms and the legs of the human-shaped player character. However, the above described embodiment may also be applied in cases where each extremity has two or more joints, with the range of motion of each intermediate portion being defined through a combination of shapes of the joint angles of the joints.

In the above described embodiment, when the right upper arm is injured, an example, in which the range of access of the end portion and the range of motion of the intermediate portion are narrowed, is shown. However, the narrowing of the range of access of the end portion and the range of motion of the intermediate portion in the case of such an injury may vary with the degree of injury. For example, in a case where the degree of injury is high, the range of access of the end portion and the range of motion of the intermediate portion may be made narrower than the range of access of the end portion and the range of motion of the intermediate portion in a case where the degree of injury is low. In this manner, the player can feel a sense of reality about the actions of the player character he/she is operating.

Situations where the range of access of the end portions and the range of motion of the intermediate portions are changed in the game include not only cases where the player character is injured, but also cases where the player characters can use a weapon or wear protective gear, and the type of the weapon or the protective gear may be changed. More specifically, in a case where a heavy weapon or heavy protective gear is used, the range of access of each end portion and the range of motion of each intermediate portion are made narrower. In a case where a light weapon or light protective gear is used, the range of access of each end portion and the range of motion of each intermediate portion are made wider.

Likewise, in a case where a status is set for the player character, the range of access of each end portion and the range of motion of each intermediate portion may be made narrower, if the status indicates a situation where the player character is poisoned or where the player character is paralyzed. Also, in a case where a status indicates the mood or mind of the player character, the range of access of each end portion and the range of motion of each intermediate portion may be made narrower when the player character is in a low mood or is feeling down, and the range of access of each end portion and the range of motion of each intermediate portion may be made wider when the player character is in a good mood or is feeling good.

Also, in a case where a situation in the virtual three-dimensional space in which the player character is operated affects movements of the player character, the range of access of each end portion and the range of motion of each intermediate portion may be changed. For example, the range of access of each end portion and the range of motion of each intermediate portion may be made narrower when the virtual three-dimensional space is in a situation where temperature is low, and the range of access of each end portion and the range of motion of each intermediate portion may also be made narrower due to gravity or a load generated when the player character is on a moving vehicle. In a case where the situation in the virtual three-dimensional space is a situation in water, the range of access of each end portion and the range of motion of each intermediate portion may also be changed.

The range of access of each end portion and the range of motion of each intermediate portion may also be changed depending on the state of action of the player character. For example, when the player character is running, the range of access of the end portions and the range of motion of the intermediate portions of both arms may be made narrower, because the range of access and the range of motion are actually limited in such a situation in reality. Also, when both wrists are tied, for example, movements of one of the arms might be limited by the influence of the other one of the arms, and the range of motion of one of the intermediate portions may be made narrower, depending on the shape of the other arm.

Also, if an extremity is moved vigorously in reality, the extremity can move over a wider range than normal. Accordingly, for the player character in the above described embodiment, the range of access of each end portion and the range of motion of each intermediate portion may also be made wider in accordance with the velocity of a previous action.

In the above described embodiment, the range of access of the end portion of each extremity and the range of motion of the intermediate portion of each extremity are set as in the example case of the right arm. However, the embodiment is not limited to that, and the range of access of the end portions and the range of motion of the intermediate portions may be defined only for both arms among the extremities.

In the above described embodiment, the range of access of the end portion of the right arm is defined, and the range of motion of the intermediate portion is defined in accordance with the position of the end portion. As for the other extremities, a range of access and a range of motion are defined for each extremity. However, if the data of the range of access of the end portion and the range of motion of the intermediate portion of one of the arms is already defined, the data may be inversed to be used as the data of the other one of the arms. In this manner, the data of the range of access and the range of motion of each extremity does not need to be stored independently of the data of the other extremities, and the amount of information can be reduced. Such a reduction in the amount of information can be applied to other creatures having symmetrical extremities, such as other mammals, reptiles, or insects.

In the above described embodiment, the procedures for modeling of the player character have been described. However, the same action modeling may be performed on non-player characters.

In the above described embodiment, modeling of actions of extremities such as arms and legs as opposed to the trunk has been described. This is because the range of motion of both arms, for example, are hardly affected by movements (such as twisting) of the trunk, as long as the shoulder joints stay in position. Meanwhile, the range of motion of the feet (or the portions below the knees) of a human being are greatly affected by movements of the thighs (or the portions above the knees), even if the feet stay in the same positions in the space. Therefore, the above described embodiment cannot be applied directly to the modeling of positions of the toes and angles of the ankles based on positions of the knees.

If a person is sitting in a chair, the thighs are fixed, and movements of the thighs relative to the range of motion of the feet can be substantially ignored. Therefore, in a case where actions of feet are modeled on the assumption that a human-shaped character is sitting in a chair, for example, the thighs are regarded as the trunk, and the feet are regarded as extremities connected to the trunk. In doing so, the knee joints are regarded as the shoulder joints of the above described embodiment, the toes are regarded as the wrists of the above described embodiment, and the ankles are regarded as the elbows of the above described embodiment. In this manner, the modeling of actions of the feet can be performed in the same manner as in the above described embodiment.

In the above described embodiment, the modeling of actions of the extremities of the player character is performed in accordance with operations by the player and progress of the game. However, actions of the player character in accordance with operations by the player and progress of the game may be modeled in advance, and the modeled actions may be performed in accordance with operations by the player and progress of the game.

In the above described embodiment, the modeling of actions of the extremities of a human-shaped player character has been described as an example. However, the above described embodiment is not limited to the above example, and can also be applied to modeling of actions of creatures with extremities, such as vertebrates with skeletons or crustaceans, and can also be applied to inanimate objects such as hydraulic shovels or robot arms.

In the above described embodiment, the modeling of actions of a character according to the present invention is applied to a video game, and the video game apparatus 100 that is a specialized game machine is used as the terminal apparatus each player uses to play the game. However, the present invention can also be applied to cases where modeling of actions of a character is performed in situations other than video games, as long as the modeling is performed by using three-dimensional computer graphics.

The apparatus that performs the modeling by a method according to the present invention may be a general-purpose personal computer, as long as the apparatus includes the same components as those of the video game apparatus 100. If capable of processing three-dimensional computer graphics, a portable game machine (or a portable telephone having a function to execute applications) that has a structure including the display device 121 and the sound output device 125 in the housing in which the main body 101 is housed may be used.

As the recording medium 131, a semiconductor memory card can be used, instead of a DVD-ROM or a CD-ROM. A card slot to which this memory card is to be inserted can be provided, instead of the DVD/CD-ROM drive 113. In the case of a general-purpose personal computer, the program and data according to the present invention are not stored in the recording medium 131, but may be stored beforehand in the HDD 107 and be then provided. The recording medium for storing and providing the program and data according to the present invention may be of any type in accordance with the physical form and the form of distribution of the hardware.

In the above described embodiment, the program and data of the video game apparatus 100 are stored in the recording medium 131, and are then distributed. However, the program and data may be stored in a fixed disk device in a server apparatus existing in the network 151, and be distributed to the main body 101 via the network 151. In the video game apparatus 100, the program and data the communication interface 115 has received from the server apparatus can be stored into the HDD 107, and be loaded into the RAM 105 at the time of execution.

REFERENCE SIGNS LIST

100 VIDEO GAME APPARATUS
101 MAIN BODY OF VIDEO GAME APPARATUS
103 CONTROL SECTION
105 RAM

107 HDD
109 SOUND PROCESSING SECTION
111 GRAPHIC PROCESSING SECTION
112 FRAME MEMORY
113 DVD/CD-ROM DRIVE
115 COMMUNICATION INTERFACE
117 INTERFACE SECTION
119 INTERNAL BUS
121 DISPLAY DEVICE
122 DISPLAY SCREEN
125 SOUND OUTPUT DEVICE
131 RECORDING MEDIUM
151 NETWORK
161 INPUT SECTION
162 MEMORY CARD

The invention claimed is:

1. An action modeling device that models an action of a character having an extremity that is connected to a trunk via a first joint and has a second joint in the middle, the extremity being rotatable around the first joint as a center within predetermined motion ranges, the action modeling device comprising:
a storage that stores a range of length of the extremity;
the storage that further stores angle range data for a plurality of extremity lengths within the range of length of the extremity, the angle range data defining different angle range sets at which the second joint is rotatable for each of the plurality of extremity lengths, each angle range set including positions of a particular portion of the extremity relative to the first joint in association with angle ranges, the particular portion being located farther from the first joint than the second joint on the extremity;
a processor; and
a memory storing instructions that, when executed by the processor, cause the processor to perform operations including:
changing a length of the extremity, the length being changed within the range of length of the extremity stored in the storage;
determining a position of the particular portion of the extremity having the length changed by the processor using the first joint as a reference position; and
determining a position of the second joint, based on one of the angle range sets corresponding to the length of the extremity changed by the processor stored in the storage in accordance with the position of the particular portion determined by the processor and a corresponding one of the angle ranges.

2. The action modeling device according to claim 1, wherein
the character is in a game,
the storage stores the angle range data for a plurality of pre-defined statuses of the character in the game, the angle range data further defining different angle range sets at which the second joint is rotatable for each of the plurality of pre-defined statuses, and
the operations further include:
determining which one of the plurality of pre-defined statuses is a current status of the character in the game; and
determining the position of the second joint, based on one of the angle range sets corresponding to the current status determined by the processor from among the angle range data stored in the storage.

3. The action modeling device according to claim 1, wherein
the storage further stores motion range data defining a range of motion of the particular portion, the range of motion being a range at which the particular portion is configured to be located relative to the first joint,
the positions of the particular portion included in each angle range set is within the range at which the particular portion is configured to be located relative to the first joint, and
the operations further include:
determining the position of the particular portion, based on the motion range data stored in the storage.

4. The action modeling device according to claim 3, wherein
the character is in a game,
the storage stores the motion range data for a plurality of pre-defined statuses of the character in the game, the motion range data defining different motion ranges at which the particular portion is configured to be located relative to the first joint, and
the operations further include:
determining which one of the plurality of pre-defined statuses is a current status of the character in the game; and
determining the position of the particular portion, based on one of the motion ranges corresponding to the current status determined by the processor from among the motion range data stored in the storage.

5. The action modeling device according to claim 1, wherein
the processor changes the length of the extremity while maintaining a constant ratio between a length from the first joint to the second joint and a length from the second joint to the particular portion,
the operations further include:
correcting the position of the particular portion relative to the first joint in accordance with the length of the extremity changed by the processor, the position of the particular portion relative to the first joint being associated with the angle range data and stored in the storage, and
the processor determines the position of the second joint, based on one of the angle range sets corresponding the position of the particular portion relative to the first joint which is corrected.

6. The action modeling device according to claim 1, wherein the length of the extremity is changed while maintaining a ratio between a length from the first joint to the second joint and a length from the second joint to the particular portion.

7. The action modeling device according to claim 1, wherein the length of the extremity is changed without maintaining a ratio between a length from the first joint to the second joint and a length from the second joint to the particular portion.

8. The action modeling device according to claim 1, wherein the length of the extremity is changed in correspondence with a size change of the character.

9. An action modeling method for modeling an action of a character in a computer apparatus, the character having an extremity that is connected to a trunk via a first joint and has a second joint in the middle, the extremity being rotatable around the first joint as a center within predetermined motion ranges, the action modeling method comprising:
storing a range of length of the extremity in a memory;
storing angle range data beforehand into into the memory, the angle range data being stored for a plurality of extremity lengths within the range of length of the extremity, the angle range data defining different angle range sets at which the second joint is rotatable for each of the plurality of extremity lengths, each angle range set including positions of a particular portion of the extremity relative to the first joint in association with angle ranges, the particular portion being located farther from the first joint than the second joint on the extremity;

changing, by a processor, a length of the extremity, the length being changed within the range of length of the extremity;

determining, by the processor, a position of the particular portion of the extremity having the length changed by the processor using the position of the first joint as a reference position; and determining, by the processor, a position of the second joint, based on one of the angle range sets corresponding to the length of the extremity changed by the processor and stored in the memory in accordance with the position of the particular portion determined by the processor and a corresponding one of the angle ranges.

10. A non-transitory computer readable medium that stores a program for causing a computer apparatus to model an action of a character having an extremity that is connected to a trunk via a first joint and has a second joint in the middle, the extremity being rotatable around the first joint as a center within predetermined motion ranges, the program causing the computer apparatus to perform operations comprising:

storing, in a memory, a range of length of the extremity;

storing, in the memory, angle range data beforehand, the angle range data being stored for a plurality of extremity lengths within the range of length of the extremity, the angle range data defining different angle range sets at which the second joint is rotatable for each of the plurality of extremity lengths, each angle range set including positions of a particular portion of the extremity relative to the first joint in association with angle ranges, the particular portion being located farther from the first joint than the second joint on the extremity;

changing, by a processor, a length of the extremity, the length being changed within the range of length of the extremity;

determining, by the processor, a position of the particular portion of the extremity having the length changed by the processor using the position of the first joint as a reference position; and determining, by the processor, a position of the second joint, based on one of the angle range sets corresponding to the length of the extremity changed by the processor stored in the memory in accordance with the position of the particular portion determined by the processor and a corresponding one of the angle ranges.

* * * * *

UNITED STATES PATENT AND TRADEMARK OFFICE
CERTIFICATE OF CORRECTION

PATENT NO. : 9,208,613 B2
APPLICATION NO. : 13/982850
DATED : December 8, 2015
INVENTOR(S) : Mukai It is certified that error appears in the above-identified patent and that said Letters Patent is hereby corrected as shown below:

IN THE CLAIMS

Column 18, line 42, claim 5, line 15 change "corresponding the" to --corresponding to the--
Column 18, line 65, claim 9, line 8 change "beforehand into into the" to --beforehand into the--

Signed and Sealed this
Twenty-ninth Day of March, 2016

Michelle K. Lee
*Director of the United States Patent and Trademark Office*